US005304746A

United States Patent [19]

Purvine

[11] Patent Number: 5,304,746

[45] Date of Patent: Apr. 19, 1994

[54] REDUCTION OF STANDING WAVES AND INTERMODULATION DISTORTION IN ELECTRO-ACOUSTIC TRANSDUCER

[76] Inventor: Harold O. Purvine, 7602 NE. 140th St., Bothell, Wash. 98011

[21] Appl. No.: 792,010

[22] Filed: Nov. 14, 1991

Related U.S. Application Data

[63] Continuation-in-part of Ser. No. 540,582, Jun. 19, 1990, abandoned.

[51] Int. Cl.[5] ........................ H05K 5/00; H04R 7/00

[52] U.S. Cl. ........................ 181/148; 181/157; 181/166; 181/167

[58] Field of Search ............... 181/148, 157, 166, 167, 181/170, 180, 199; 381/158

[56] References Cited

U.S. PATENT DOCUMENTS

| | | | |
|---|---|---|---|
| 1,298,290 | 3/1919 | Chalmers | 181/166 |
| 1,480,785 | 1/1924 | Semple, Jr. | 181/166 |
| 1,560,552 | 11/1925 | Esterbrook | 181/166 |
| 1,673,661 | 6/1928 | Brigham | 181/166 |
| 1,689,513 | 10/1928 | Zimmerman | 181/166 |
| 1,757,451 | 5/1930 | Crane | 181/166 |
| 1,792,536 | 2/1931 | Harrison | 181/180 |
| 1,815,987 | 7/1931 | Peterson | 181/164 |
| 2,071,829 | 2/1937 | Glen | 181/166 |
| 3,424,873 | 1/1969 | Walsh | 181/166 |
| 4,020,299 | 4/1977 | Garner et al. | 181/166 |
| 4,100,992 | 7/1978 | Rehde et al. | 181/166 |
| 4,254,184 | 3/1981 | Tsukagoshi et al. | 181/167 |
| 4,266,092 | 5/1981 | Barker, III | 181/144 |

*Primary Examiner*—Michael L. Gellner
*Assistant Examiner*—Eddie C. Lee
*Attorney, Agent, or Firm*—Christensen, O'Connor, Johnson & Kindness

[57] ABSTRACT

A pattern of blocks or other features is formed on the diaphragm of an electro-acoustic transducer. The features in the pattern extend along and adjacent to an edge of the diaphragm. The features in a pattern are preferably arranged along two parallel lines, with a pair of features along one line positioned adjacent to a gap in the other line. Similar patterns may also be formed along a second, opposite edge of the diaphragm, and/or on enclosing surfaces adjacent to a transducer. The diaphragm may further be covered by a conformal coating which allows vibratory energy propagating through the surface to exceed the speed of sound through air.

19 Claims, 6 Drawing Sheets

Fig. 1.
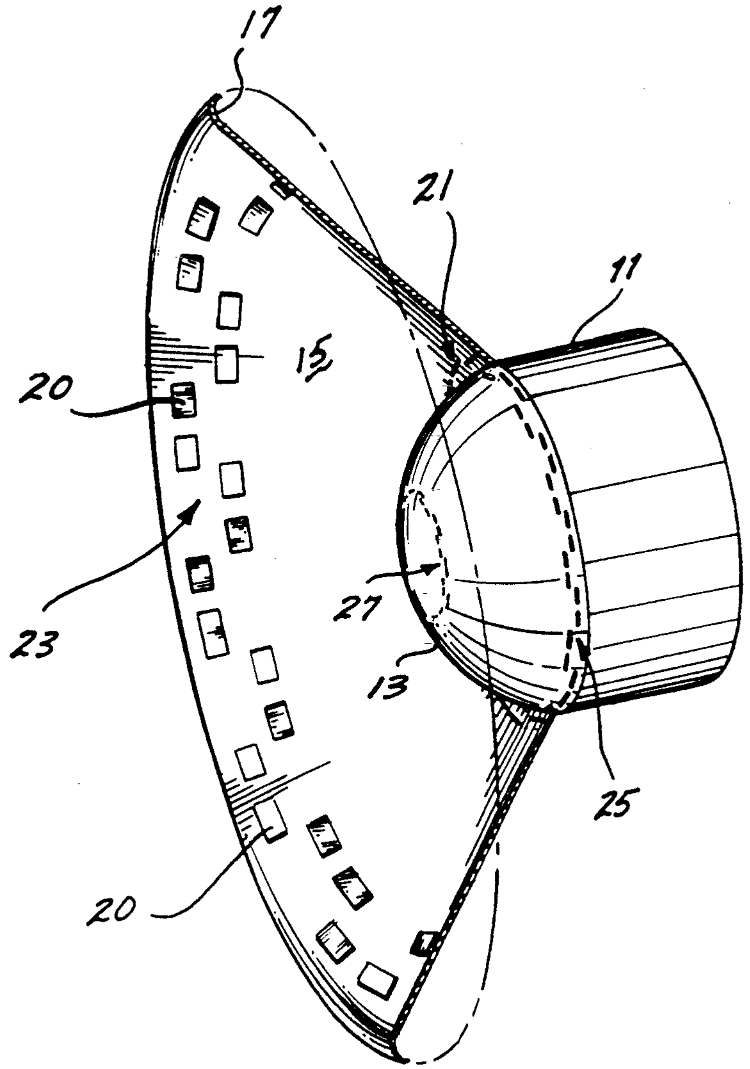
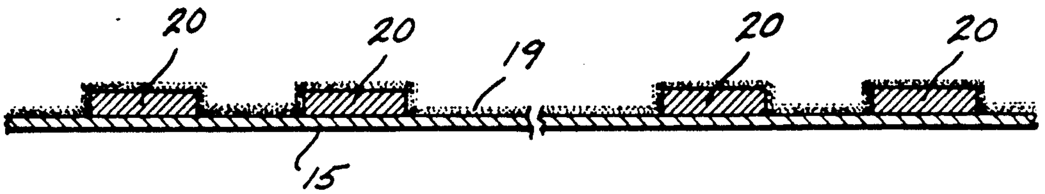
Fig. 2.

REDUCTION OF STANDING WAVES AND INTERMODULATION DISTORTION IN ELECTRO-ACOUSTIC TRANSDUCER

CROSS REFERENCE TO RELATED APPLICATION

This application is a continuation-in-part of a U.S. patent application entitled Method For Enhancing The Output Of An Electro-Acoustic Transducer By Eliminating Standing Wave And Intermodulation Distortion, filed Jun. 19, 1990, Ser. No. 07/540,582 now abandoned.

FIELD OF THE INVENTION

This invention is directed to electro-acoustic transducers and, more particularly, to techniques for improving the accuracy of the output of electro-acoustic transducers.

BACKGROUND OF THE INVENTION

It has long been the objective in sound reproduction to have the reproduction as spectrally accurate and realistic as possible. In almost all cases, the reproduction of sound is accomplished by electro-acoustic transducers. Generally, these transducers are comprised of a voice coil which converts an electrical signal to an oscillatory motion in a diaphragm. The diaphragm acts to transfer the oscillatory energy to the surrounding medium, thus producing an audible sound.

It is well known that current electro-acoustic transducers do not ensure correct retransmission of sounds. Specifically, distortion caused by standing wave phenomena and intermodulation distortion result in erroneous sound reproduction.

A standing wave can be described as the summation of two waves of the same frequency traveling in opposite directions. Typically, standing waves are generated when a propagating wave in a medium is reflected by a discontinuity in the medium. The reflected wave combines with the main propagating wave to form a standing wave. A medium subject to standing wave phenomena will exhibit standing waves having frequencies determined by the initial propagating wave frequency, and the physical characteristics of the particular medium.

In musical instruments, these standing wave resonances can be heard as the "voice" of the instrument. In electro-acoustic transducers, these standing waves tend to manifest themselves as harmonics of the base frequencies, and distort the overall quality of the sound reproduction. Furthermore, the newly formed harmonic frequencies act to cause intermodulation distortion, which can best be described as the nonlinear combination of differing frequencies with one another to produce frequencies equal to the sums and differences of the original frequencies. It can be seen that because of these additional frequencies, the original signal is corrupted. Thus, the reduction or elimination of standing waves from vibrating areas will remove a large portion of the harmonic and intermodulation distortions occurring in electro-acoustic transducers. This can be done by removing the discontinuity, or by removing the effects of the discontinuity.

SUMMARY OF THE INVENTION

The techniques described herein remove or reduce the effects of a discontinuity on an active surface of an electro-acoustic transducer. The term "active surface" denotes either an amplifying surface through which electrical energy is initially transduced into acoustic energy (e.g., a speaker diaphragm), or a reflecting surface that reflects acoustic energy generated at the amplifying surface (e.g., a surface that encloses or is adjacent to a speaker diaphragm). The effects of the discontinuity are removed by providing structures or features on the active surface that allow a transverse wave to pass only in one direction. Thus, any reflection from a discontinuity further along the surface will be unable to interfere with the incident wave. Consequently, a very small reflective wave is present, and standing wave formation is reduced.

In one aspect, the present invention provides an electro-acoustic transducer formed so as to reduce standing waves and harmonic and intermodulation distortion. The transducer includes an active surface, e.g., an amplifying surface for radiating acoustic energy. The invention provides a plurality of features positioned in a pattern on the amplifying surface, each feature comprising a portion of the amplifying surface having a height different than the height of the portions of the amplifying surface surrounding the feature. The features in the pattern extend along and adjacent to at least a substantial portion of a discontinuity, e.g., an edge of the amplifying surface. In the case of a conical diaphragm having inner and outer edges, separate patterns preferably extend along and adjacent to each edge. The patterns can also be placed on reflecting services, e.g., a surface that encloses or is adjacent to an electro-acoustic transducer, and that reflects energy produced by the transducer.

In a preferred arrangement, the features are arranged along a pair of generally parallel, closely spaced lines. The features along each line are grouped into pairs separated by gaps, the pairs in one line being adjacent to the gaps in the other line. The amplifying surface may also be coated with a conformal surface coating that has a wave propagation rate exceeding the propagation rate of sound through air. The features themselves may comprise blocks of material fastened to the diaphragm, raised molded portions of the diaphragm, or embossed portions of the diaphragm.

The result of this invention is the substantial elimination of standing waves and of intermodulation and harmonic distortion present in the prior art. Further features and advantages of the invention will become apparent during the course of the following description in which reference is made to the accompanying drawings, and which is provided purely by way of nonrestrictive example.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 is a pictorial view of an acoustic loudspeaker constructed in accordance with the present invention;

FIG. 2 shows a pictorial representation of a cross section of the diaphragm of the loudspeaker shown in FIG. 1;

DETAILED DESCRIPTION OF THE PREFERRED EMBODIMENT

Figure 3:
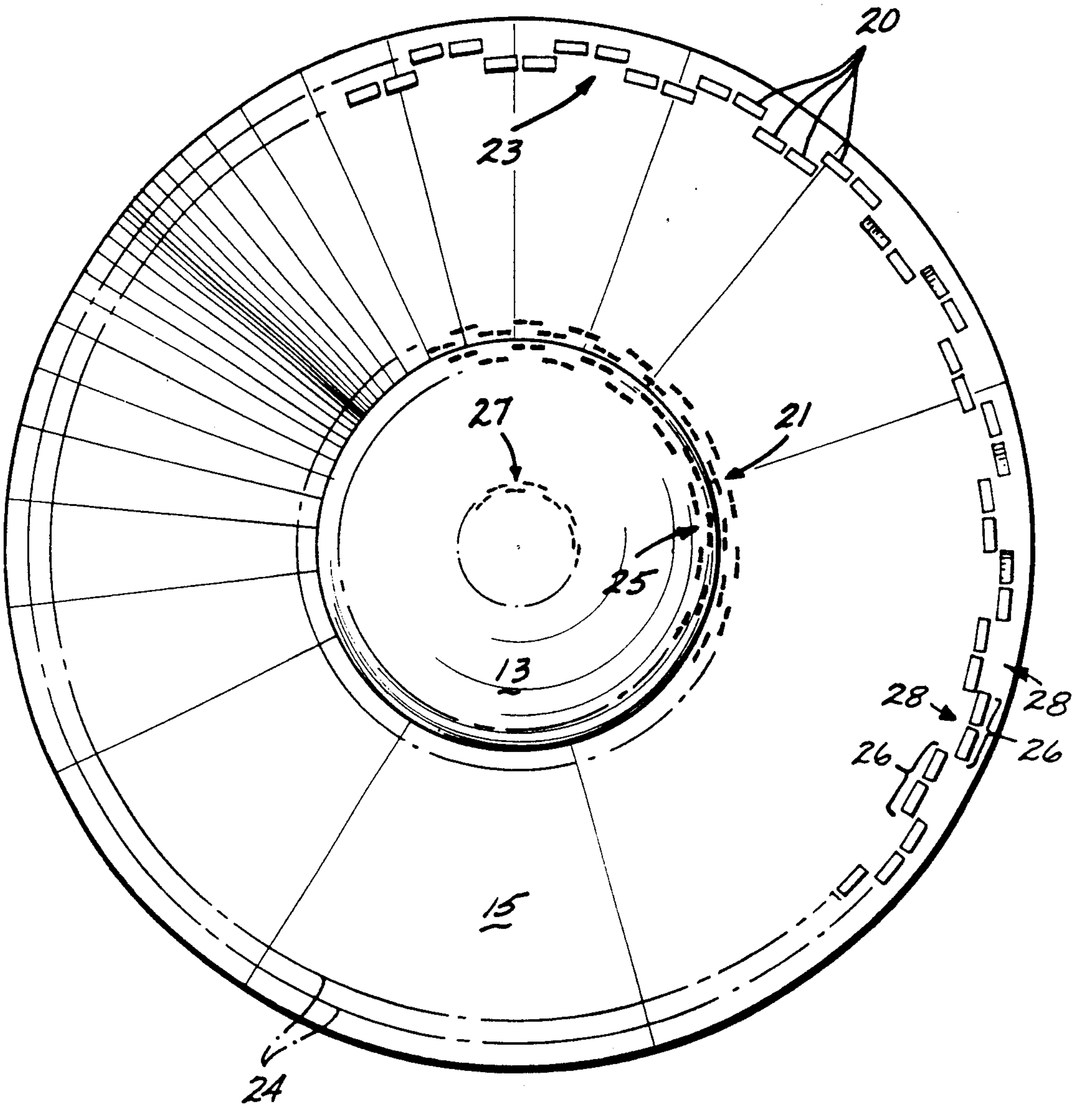
FIG. 3 shows a top pictorial view of the acoustical loudspeaker of FIG. 1.

FIGS. 1-4 illustrate a loudspeaker that which has been formed in accordance with the present invention. Referring initially to FIG. 1, the loudspeaker is comprised of voice coil 11, center diaphragm 13, main diaphragm 15, and surround 17. Located on the inside surface of main diaphragm 15 are a plurality of surface features arranged in an inner pattern 21 and an outer pattern 23. Inner pattern 21 extends along and adjacent to the inside edge of diaphragm 15, while outer pattern 23 extends along and adjacent to the outside edge of diaphragm 15. Similarly located on the convex outer surface of center diaphragm 13 are surface features arranged in outer pattern 25 that extends along the outside edge of diaphragm 13, and inner pattern 27 that forms a loop near the center of diaphragm 13. Not shown in FIG. 1, but which can be more clearly seen in FIG. 2, is a conformal coating 19 which completely covers the inside surface of main diaphragm 15 and the convex outside surface of diaphragm 13.

Figure 4:
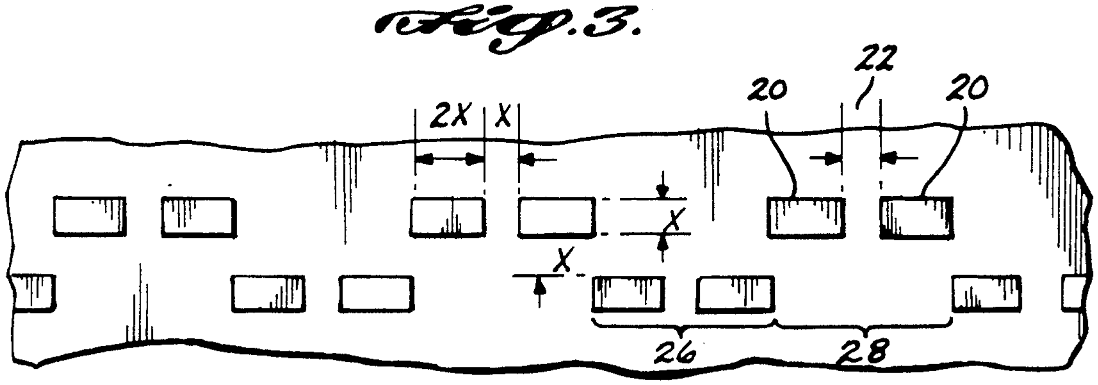
FIG. 4 shows a magnified top view of a segment of the acoustical diaphragm.

Referring now to FIG. 2, in one preferred embodiment the features 20, of which patterns 21, 23, 25 and 27 are formed, comprise rectangular blocks 20 which are of right parallelepiped shape, and whose relative positions and dimensions can best be seen in FIGS. 3 and 4. In the illustrated embodiment, the features of each pattern, for example pattern 23, are arranged along a pair of closely spaced lines 24, the features along each line being grouped into pairs 26 separated by gaps 28. The features along one line are staggered with respect to those along the other line, such that the pairs 26 in one line are positioned adjacent to gaps the 28 in the other line. Pattern 21 is located near the base of the main conical diaphragm 15 close to the voice coil 11. Pattern 23 is disposed near the outer edge of the main conical diaphragm 15 close to the surround 17, maximally spaced from pattern 21.

The exact locations of the patterns of features are not crucial; however, it is advantageous to space the patterns maximally apart such that the effective size of each diaphragm is maximum. Generally, the effective size of the diaphragm in a loudspeaker is the area between terminus points, i.e., the area between surround 17 and voice coil 11 for diaphragm 15. It will be appreciated by those skilled in the art that the larger the effective size of the diaphragm 15, the lower the frequency the acoustic loudspeaker may reproduce. It will be seen below that each pattern of blocks or other features serves as an artificial terminus for waves propagating through the diaphragm, and that the effective size of the diaphragm, free of standing wave interference, is determined by the spacing of the patterns. It can also be seen that if only one pattern is applied to the diaphragm, its placement would determine the area essentially free of standing waves. Thus, a single pattern should also be close to a physical terminus as exemplified by the pattern 23 of main conical diaphragm 15. Since a standing wave must form between two terminus points, this method would be effective, though not optimal.

Analogous to patterns 21 and 23 on the main conical diaphragm 15 are an analogous pair of patterns 25 and 27 on the center dome diaphragm 13. Once again, each of patterns 25 and 27 comprises blocks 20 arranged in a pair of concentric, staggered rings, both centered about the central apex of diaphragm 13. Pattern 25 is centered about the base of the center dome diaphragm 13 near the voice coil 11, while pattern 27 is centered about the apex of the center dome diaphragm 13 and disposed near the apex of the center dome diaphragm 13.

Figure 5:
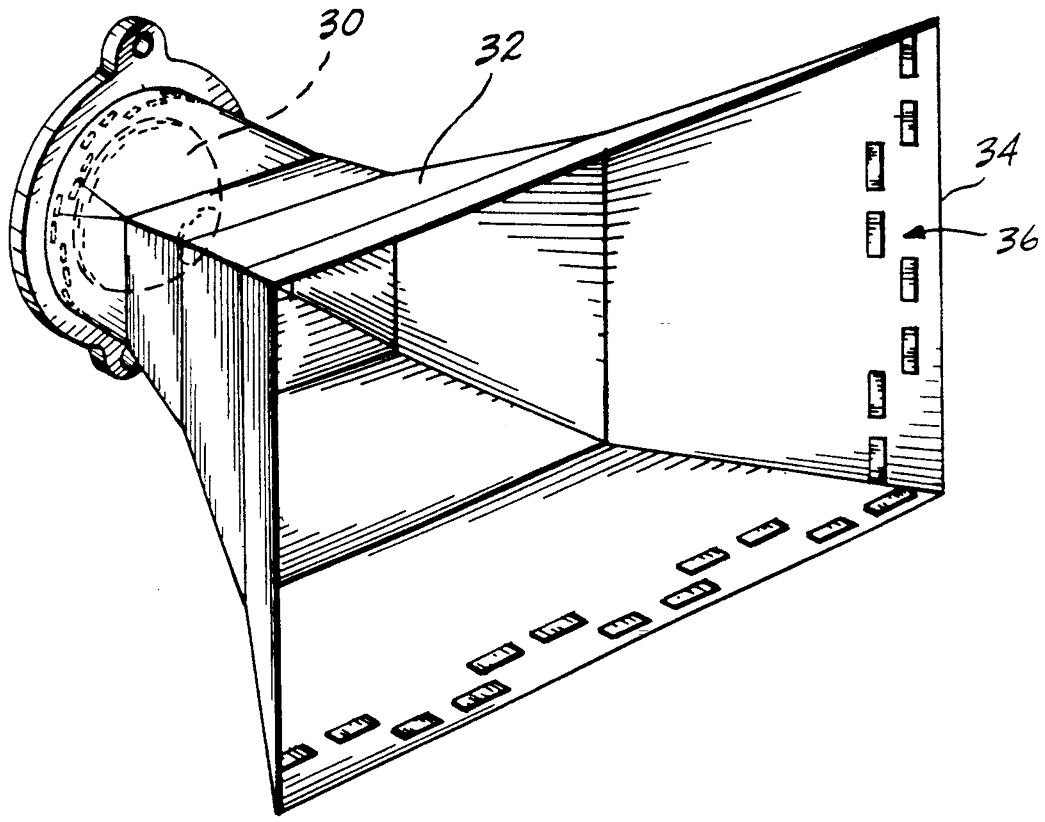
FIG. 5 shows a horn speaker that includes the present invention.

In the case of a conical acoustic loudspeaker, the lines forming each pattern, and the patterns themselves are preferably concentric circles. However, the patterns may be of any shape, but should conform to the shape of the transducer diaphragm. For example, as seen in FIG. 5, in a type of loudspeaker known as a compression-horn, the function of the diaphragm is typically accomplished by mounting a dome loudspeaker 30 in the small terminus of horn 32. This dome should be treated in a manner similar to the center dome diaphragm 13 of FIGS. 1-4. Horn 32 has a right rectangular polygonal cross-sectional shape, and accepts the output of the dome loudspeaker 30, compressing and focusing the output. Through the geometry of the horn shape, the compressed sound waves are beamed out the flared end of the horn. In an untreated horn, the physical terminus edges 34 of the horn will support the generation of standing waves, in the manner of a horn bell in a musical instrument. Application of pattern 36, as shown in FIG. 5, substantially eliminates the standing wave propagation. Pattern 36 should be right rectangular to conform to the shape of the particular propagation medium. However, as is generally the case, the majority of acoustic loudspeakers are of conical shape, and therefore the pattern will be of concentric circular shape centered about the center point of the diaphragms.

FIG. 4 is an expanded view of a section of pattern 23 on diaphragm 15, showing preferred relative shapes and spacing of blocks 20, expressed in unit values (denoted by x). Each block 20 has a length of two units, a width of one unit, and a thickness of one unit as measured normal to the diaphragm surface (see FIG. 2). The circumferential separation between the two lines of blocks is one unit. The gaps 28 between blocks 20 of adjacent pairs in a line is five units measured circumferentially. Thus the arrangement of the pattern is as follows: a block 20 of two units circumferential distance, followed by an inter-block spacing 22 of one unit, followed by another block 20 of circumferential length two units and, finally, a gap 28 with a circumferential distance of five units before the beginning of the next pair 26. The use of the term "circumferential" implies only a circular or curvilinear slope. However, as noted earlier, the patterns do not need to be of a circular shape, and it will be appreciated that references to "circumferential" lengths and distances are intended to convey perimeter lengths and distances in non-circular ring shapes.

It has been determined that optimal elimination of standing waves and intermodulation distortion in this particular embodiment is achieved when each pattern is comprised of eighteen pairs 26 of blocks 20. It will be appreciated that the exact dimensions of each pair and therefore the exact dimensions of each block 20, is wholly dependent upon the location of the pattern. For example, the size of the blocks 20 in the pattern 21 located near the base of the main diaphragm will be less than those blocks 20 comprising pattern 23 near the outer edge of the main diaphragm. Since the radius of pattern 21 is much less, in order to have eighteen pairs, it is necessary to modify the size of block 20 accordingly. For circular patterns, a more general description of size of each block may be obtained by measuring their size in terms of angular displacement. For example, it will be appreciated that given eighteen pairs of blocks 20, each pair is allotted twenty degrees of angular displacement, including the gaps 28 between the individual members of a pair. Further, although the preferred member of block pairs is eighteen, for clarity in the accompanying illustrations, FIGS. 1–6 do not show eighteen pairs.

The illustration of FIG. 3 is exemplary and not exclusive. For example, although in this particular embodiment eighteen block pairs are contained in a ring, it will be appreciated that greater or fewer pairs may comprise a ring. Further, the radial width of each block may be increased or decreased and the separation between the rings comprising a pair may be increased or decreased. The important consideration is that the relative positions of the pairs of each line comprising a pattern are shifted relative to one another such that the block pairs of one line radially shield the gap 28 between the block pairs of the second line. This type of arrangement is employed for all of the patterns on both diaphragms.

In the embodiment illustrated in FIGS. 1–4, and particularly in FIG. 2, the material used to form the blocks may be different than the diaphragm material. In one embodiment of the invention, acrylic paint has been found to be a suitable material for blocks 20. It will be appreciated that many materials are acceptable, however, it is preferable that the material is able to adhere well to the diaphragm material, therefore the added suitability of acrylic paint can be appreciated.

Figure 6:
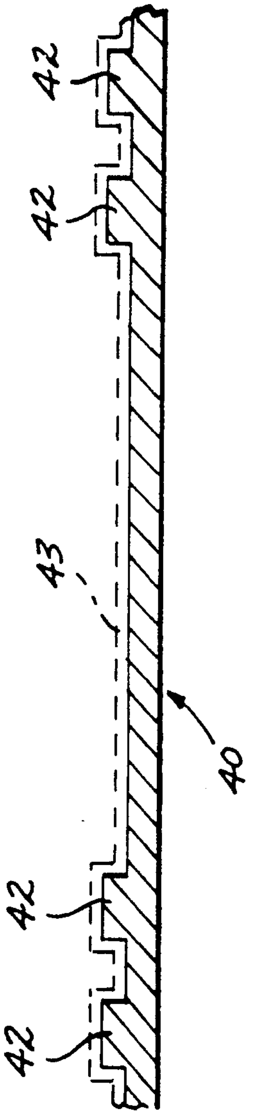
FIG. 6 illustrates creation of the features by molding.
Figure 7:
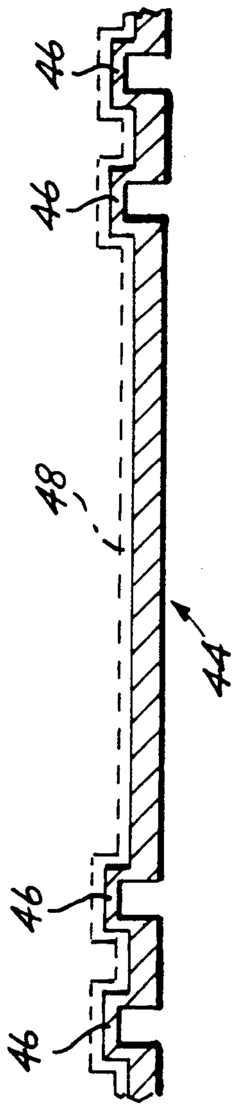
FIG. 7 illustrates creation of the features by embossing.

FIGS. 6 and 7 illustrate two alternate techniques for forming the features on diaphragm surfaces. In FIG. 6, diaphragm 40 is molded so as to form raised areas 42 that are fully analogous to block 20 of the prior embodiments, except that they are formed from the same material as that forming the diaphragm. Similarly, FIG. 7 shows an embodiment in which diaphragm 44 includes embossed areas 46 which once again are fully analogous to blocks 20.

After the features have been formed on the diaphragm, a conformal surface coating may be placed over the diaphragm, the conformal surface coating being in addition to any conventional coating steps (e.g., sealing) that may be performed. The conformal coatings are illustrated by reference numeral 19 in FIG. 2, 43 in FIG. 6, and 48 in FIG. 7. Preferably, the conformal coating covers the entire inner surface of the main diaphragm 15, and the entire convex outer surface of center diaphragm 13. These conformal coatings serve to increase the speed of propagation of waves along the surface of the diaphragm, such that it exceeds the speed of sound through air. This allows a greater energy density in the membrane. The conformal coating also facilitates energy transfer between the main diaphragm 13 and center diaphragm 15 to the surrounding medium at the transmission interface. Typically the conformal coating material is any material which has a wave propagation speed greater than that of sound in air. Furthermore, as the term "conformal coating" suggests, the material should be viscous and adjust to diaphragm surface discontinuities. Examples of suitable coating materials are fine grade furniture varnishes or hardened polyvinyl alcohols (PVA).

Figure 8A:
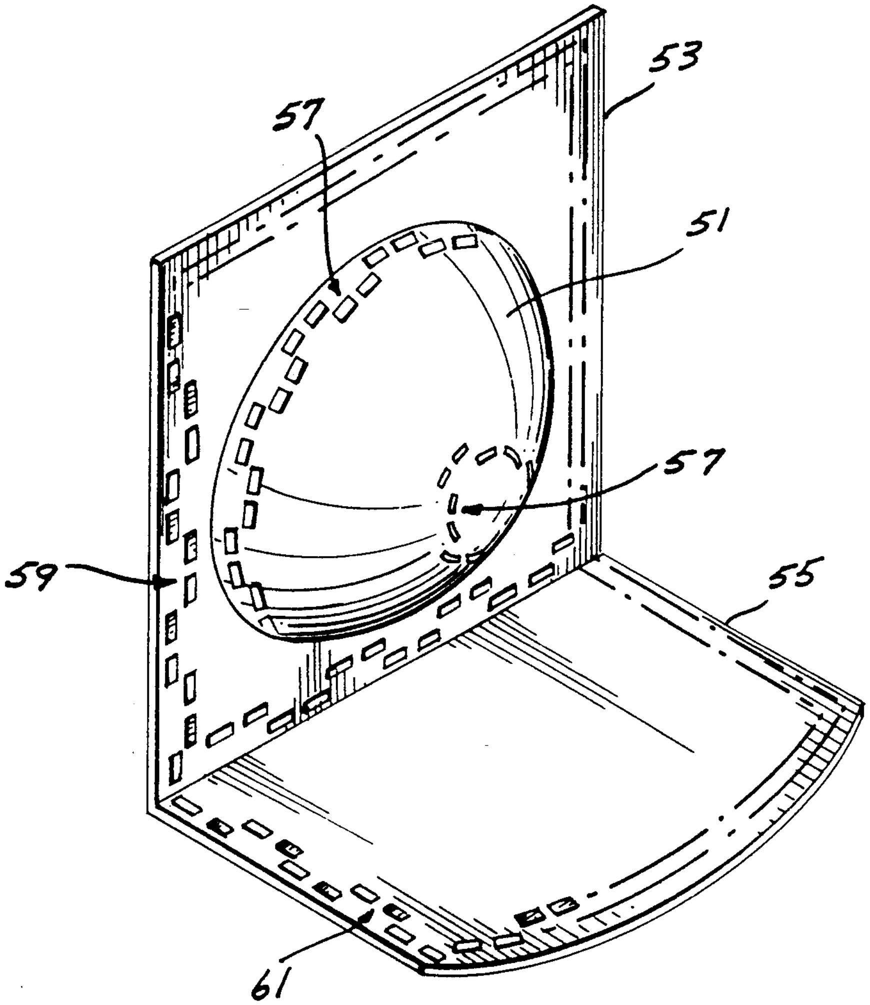
FIGS. 8A and 8B show applications of the invention for enclosing surfaces of a transducer.
Figure 8B:
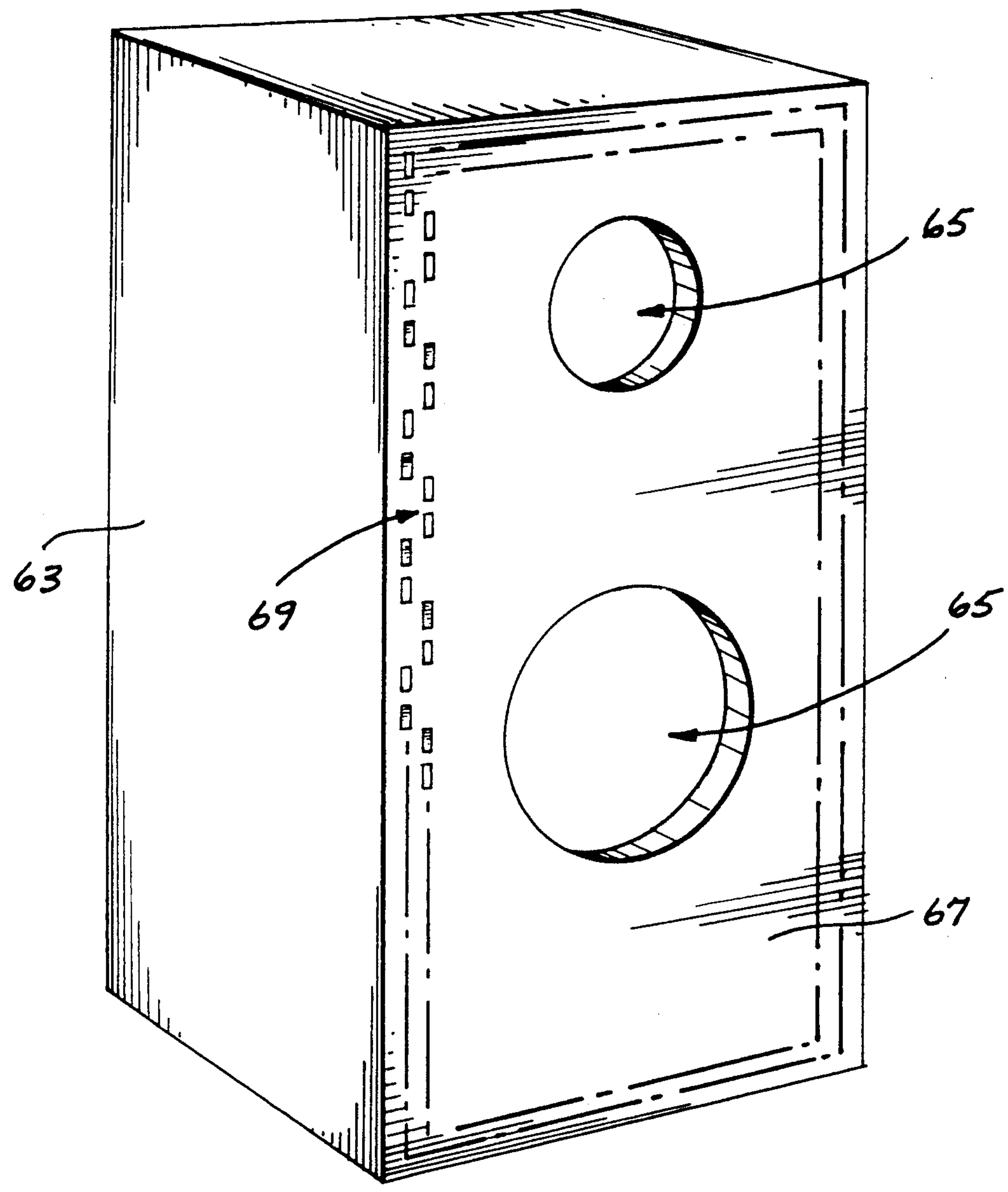

Although the placement of the patterns has been illustrated primarily in conjunction with a cone electro-acoustic transducer having a diaphragm and with a horn-type speaker, the patterns of the present invention may be applied to any surface which encloses or is adjacent to an electro-acoustic transducer. FIGS. 8A and 8B show other embodiments of the present invention. With reference to FIG. 8A, the dome diaphragm 51 of an electro-acoustic transducer is held by a mounting plate 53, and a deflecting plate 55 is attached and disposed orthogonally to the mounting plate 53. Patterns 57 and 58 are located on dome diaphragm 51, as described above. In addition, pattern 59 is located around the perimeter of the mounting plate 53, and pattern 61 is located around the perimeter of the deflector plate 55. The mounting plate 53 may be said to form an enclosing surface which surrounds the dome diaphragm and as such, the pattern 59 performs the same function of eliminating standing wave and intermodulation distortion. Similarly, deflector plate 55 is considered an adjacent surface to dome diaphragm 51 and as such, the pattern 61 also performs the function of eliminating standing wave and intermodulation distortion. In sum, the method of the present invention may be applied to any surface which is susceptible to the formation of sympathetic oscillations caused by the acoustic action of a proximately located electro-acoustic transducer.

Next, with reference to FIG. 8B, a speaker enclosure 63 well known in the art is used to support the electro-acoustic transducers 65. Similar to the mounting plate 53 of FIG. 8A, the mounting board 67 of the speaker enclosure 63 may be considered an enclosing surface. Thus, pattern 69 may be placed about the perimeter of the mounting board, in order to reduce standing waves and intermodulation distortion. Thus, in the alternate embodiments shown in FIGS. 8A and 8B, a pattern may be placed about the perimeter of any enclosing surface or any adjacent surface of an electro-acoustic transducer.

The combination of the patterns and conformal coating disclosed will substantially reduce standing wave and intermodulation distortion found in many of the individual transducers of loudspeaker systems. While the preferred embodiment of the invention has been illustrated and described, it will be appreciated that various changes can be made therein without departing from the spirit and scope of the invention. For example, while the blocks described in the present application are of right rectangular parallelpiped configuration, it will be appreciated that many other shapes will function to produce the advantages of the invention. For example, the shape of the blocks 20 can be of a segmented annulus shape, the radius of the annulus conforming to the radius of the pattern. Also, although the described embodiment has the pattern located on the inner surface of the diaphragm, it is also possible to place the pattern on the outer surface or on both surfaces. Additionally, there are applications where a small percentage of distortion, dependent upon incomplete elimination of standing wave phenomena, is desirable. In these cases, a single pattern can be applied, e.g., to the terminus point farthest from or nearest to the voice coil, or a medium distance from the voice coil. Thus the invention can be practiced otherwise than as specifically described herein.

The embodiments of the invention in which an exclusive property or privilege is claimed are defined as follows:

1. In combination with an electro-acoustic transducer having an active surface for radiating or reflecting acoustic energy, said active surface having a discontinuity, the improvement comprising a plurality of features positioned in a pattern on the active surface, each feature comprising a portion of the active surface having a height different than the height of the portions of the active surface surrounding the feature, the features being grouped into pairs, each feature being separated from each adjacent feature by a gap, the width of said gap being approximately one half the width of the adjacent features, and the features in the pattern extending along and adjacent to at least a substantial portion of said discontinuity 2. The improvement of claim 1, wherein the discontinuity forms a closed shape, and wherein the features in the pattern extend along and adjacent to the entire discontinuity.

3. The improvement of claim 1, wherein the features are arranged along a pair of generally parallel, closely spaced lines.

4. The improvement of claim 3, wherein the pairs in one line are positioned adjacent to the gaps in the other line.

5. The improvement of claim 1, wherein the active surface is coated with a conformal coating which has a wave propagation rate exceeding the propagation rate of sound through air.

6. The improvement of claim 1, wherein the active surface comprises an amplifying surface for radiating acoustic energy, wherein the transducer comprises driving means for driving the amplifying surface, and wherein the amplifying surface comprises first and second patterns, the features in the first pattern extending along and adjacent to at least a substantial portion of a first discontinuity of the amplifying surface closets to the driving means, and the features of the second pattern extending along and adjacent to at least a substantial portion of a second discontinuity of the amplifying surface furthest from the driving means.

7. The improvement of claim 6, wherein the features of each pattern are arranged along a pair of generally parallel, closely spaced lines.

8. The improvement of claim 7, wherein the features along each line are grouped into pairs separated by gaps, and wherein for each pattern, pairs in one line are positioned adjacent to the gaps in the other line.

9. The improvement of claim 6, wherein the active surface is coated with a conformal coating which has a wave propagation rate exceeding the propagation rate of sound through air.

10. The improvement of claim 1, wherein each feature comprises a block of material secured to the active surface.

11. The improvement of claim 1, wherein each feature comprises a raised, molded portion of the active surface.

12. The improvement of claim 1, wherein each feature comprises an embossed portion of the active surface.

13. A method of modifying an electro-acoustic transducer so as to reduce standing wave formation and intermodulation distortion, the transducer comprising an active surface for radiating or reflecting acoustic energy, the active surface having a discontinuity, the method comprising forming a plurality of features positioned in a pattern on the active surface, each feature comprising a portion of the active surface having a height different from the height of the portions of the active surface surrounding the feature, the features being grouped into pairs, each feature being separated from each adjacent feature by a gap, the width of said gap being approximately one half the width of the adjacent features, and the features in the pattern extending along and adjacent to at least a substantial portion of said discontinuity.

14. The method of claim 13 comprising the further step of coating the active surface with a conformal coating that has a wave propagation rate exceeding the propagation rate of sound through air.

15. The method of claim 13, wherein the active surface comprises an amplifying surface for radiating acoustic energy, wherein the transducer comprises driving means for driving the amplifying surface, and wherein the method comprises forming first and second patterns on the amplifying surface, the features in the first pattern extending along and adjacent to at least a substantial portion of a first discontinuity of the amplifying surface closest to the driving means, and the features of the second pattern extending along and adjacent to at least a substantial portion of a second discontinuity of the amplifying surface furthest from the driving means.

16. In combination with an electro-acoustic transducer having an active surface for radiating or reflecting acoustic energy, said active surface having a discontinuity, the improvement comprising a plurality of features positioned in a pattern on the active surface so as to substantially prevent sound energy reflected from the discontinuity from forming standing waves on the active surface, each feature comprising a portion of the active surface having a height different than the height of the portions of active surface surrounding the feature, the features and the pattern extending along and adjacent to at least a substantial portion of said discontinuity and the features being grouped into pairs, each feature being separated from each adjacent feature by a gap, the width of said gap being approximately one-half the width of the adjacent features.

17. The improvement of claim 16, wherein the discontinuity forms a closed shape, and wherein the features in the pattern extend along and adjacent to the entire discontinuity.

18. The improvement of claim 16, wherein the features are arranged along a pair of generally parallel, closely spaced lines.

19. The improvement of claim 10, wherein the features arranged along one of the pair of generally parallel, closely spaced lines are positioned adjacent to said gaps between the features arranged along the other line of the pair of generally parallel, closely spaced lines.

* * * * *

UNITED STATES PATENT AND TRADEMARK OFFICE

CERTIFICATE OF CORRECTION

PATENT NO. : 5,304,746

DATED : April 19, 1994

INVENTOR(S) : H. O. Purvine

It is certified that error appears in the above-indentified patent and that said Letters Patent is hereby corrected as shown below:

| COLUMN | LINE | |
|---|---|---|
| 7 (Claim 6 | 42 Line 8) | "closets" should read --closest-- |
| 8 | 60 | "claim 10" should read --claim 18-- |

Signed and Sealed this

Twenty-third Day of August, 1994

Attest:

BRUCE LEHMAN

*Attesting Officer*

*Commissioner of Patents and Trademarks*